US012812927B2

(12) United States Patent
Van Brunt et al.

(10) Patent No.: US 12,812,927 B2
(45) Date of Patent: Nov. 24, 2026

(54) POWER SEMICONDUCTOR DEVICES HAVING NON-RECTANGULAR SEMICONDUCTOR DIE FOR ENHANCED MECHANICAL ROBUSTNESS AND REDUCED STRESS AND ELECTRIC FIELD CONCENTRATIONS

(71) Applicant: Wolfspeed, Inc., Durham, NC (US)

(72) Inventors: Edward Robert Van Brunt, Cary, NC (US); Brice McPherson, Fayetteville, AR (US); Josh S. Pennington, Springdale, AR (US)

(73) Assignee: Wolfspeed, Inc., Durham, NC (US)

( * ) Notice: Subject to any disclaimer, the term of this patent is extended or adjusted under 35 U.S.C. 154(b) by 571 days.

(21) Appl. No.: 18/107,537

(22) Filed: Feb. 9, 2023

(65) Prior Publication Data

US 2024/0274660 A1 Aug. 15, 2024

(51) Int. Cl.
*H10D 62/10* (2025.01)
*H10D 62/40* (2025.01)
(Continued)

(52) U.S. Cl.
CPC ......... *H10D 62/117* (2025.01); *H10D 62/102* (2025.01); *H10D 62/127* (2025.01); *H10D 62/405* (2025.01); *H10D 64/512* (2025.01); *H10D 64/519* (2025.01); *H10W 90/731* (2026.01)

(58) Field of Classification Search
CPC .. H10D 62/117; H10D 62/102; H10D 62/127; H10D 64/512; H10D 64/519; H10D 62/8325; H10D 84/0135–0142; H10D 84/0172–0179; H10D 62/40–405; H01L 24/32; H01L 2224/32221; H01L 2924/10156; H01L 2924/13091; H01L 21/78; H01L 21/02428–0243; H10W 90/731
See application file for complete search history.

(56) References Cited

U.S. PATENT DOCUMENTS

| | | | | |
|---|---|---|---|---|
| 12,364,082 B2 * | 7/2025 | Shen | .................... | H10H 20/857 |
| 2012/0313111 A1 | 12/2012 | Hallock et al. | | |

(Continued)

FOREIGN PATENT DOCUMENTS

| | | | | |
|---|---|---|---|---|
| CN | 103718298 A * | 4/2014 | ........... | H10D 64/513 |
| EP | 3979331 A1 | 4/2022 | | |

(Continued)

OTHER PUBLICATIONS

"Notification of Transmittal of the International Search Report and the Written Opinion of the International Searching Authority, or the Declaration for corresponding International Application No. PCT/US2024/011753, mailing date Jun. 14, 2024, (19 pages)".

(Continued)

*Primary Examiner* — Shahed Ahmed
(74) *Attorney, Agent, or Firm* — Myers Bigel, P.A.

(57) ABSTRACT

Semiconductor devices comprises a semiconductor die that comprises a substrate that has a hexagonal crystal structure. First and second sides of the semiconductor die extend along respective first and second crystallographic axes of the hexagonal crystal structure of the substrate.

23 Claims, 11 Drawing Sheets

(51) Int. Cl.
*H10D 64/27* (2025.01)
*H10W 90/00* (2026.01)

(56) References Cited

U.S. PATENT DOCUMENTS

| | | | | |
|---|---|---|---|---|
| 2015/0108501 | A1 | 4/2015 | Iwamuro et al. | |
| 2016/0079472 | A1 | 3/2016 | Pun et al. | |
| 2016/0225742 | A1* | 8/2016 | Davis | H01L 25/50 |
| 2017/0345891 | A1* | 11/2017 | Van Brunt | H10D 62/106 |
| 2023/0062475 | A1* | 3/2023 | Kumada | H10D 30/668 |

FOREIGN PATENT DOCUMENTS

| | | | |
|---|---|---|---|
| JP | H0982587 | A | 3/1997 |
| JP | 2004063860 | A | 2/2004 |
| JP | 2016111086 | A | 6/2016 |
| JP | 2020027858 | A | 2/2020 |
| JP | 2020088239 | A | 6/2020 |
| JP | 2020194920 | A | 12/2020 |

OTHER PUBLICATIONS

"Invitation to Pay Additional Fees for International Patent Application No. PCT/US2024/011753, mailed Apr. 23, 2024, 10 pages".

* cited by examiner

POWER SEMICONDUCTOR DEVICES HAVING NON-RECTANGULAR SEMICONDUCTOR DIE FOR ENHANCED MECHANICAL ROBUSTNESS AND REDUCED STRESS AND ELECTRIC FIELD CONCENTRATIONS

FIELD OF THE INVENTION

The present invention relates to semiconductor devices and, more particularly, to power semiconductor devices having semiconductor die with non-rectangular shapes.

BACKGROUND

Semiconductor devices are often used in applications where the semiconductor device must pass large current levels in their "on" state and block large voltages in their reverse blocking or "off" state. For example, there is demand for Metal Oxide Semiconductor Field Effect Transistors ("MOSFETs") that can pass tens or even hundreds of Amps of current in their on state and block hundreds or even thousands of volts in their reverse blocking state. In order to support large current densities and block such high voltages, power MOSFETs and other power semiconductor devices such as power Junction Barrier Schottky ("JBS") diodes, Insulated Gate Bipolar Junction Transistors ("IGBTs"), Junction Field Effect Transistors ("JFETs"), gate-controlled thyristors, and the like typically have a vertical structure with at least one contact on each of the two opposed sides of a thick semiconductor layer structure. Herein, the term "semiconductor layer structure" refers to a structure that includes one or more semiconductor layers, such as semiconductor substrates and/or semiconductor epitaxial layers.

The semiconductor layer structure of a power semiconductor device typically includes an "active region" that has one or more functional semiconductor devices that have a junction such as a p-n junction. The active region acts as a main junction for blocking voltage during reverse bias operation and providing current flow during forward bias operation. The power semiconductor device may also have an edge termination structure in a termination region of the semiconductor layer structure such as a series of guard rings or a Junction Termination Extension ("JTE"). The edge termination structure may be designed to reduce the build-up of electric field concentration that otherwise naturally occurs along the edges of a semiconductor die during device operation. The termination region may surround the active region when the semiconductor die is viewed in plan view. Herein, a "plan view" of a semiconductor die refers to a view of the semiconductor die that is taken along an axis that is perpendicular to a center of a major surface of the semiconductor layer structure of the semiconductor die. The plan view is typically a view of the top surface of the semiconductor die.

Multiple power semiconductor devices are usually formed on a wafer, which refers to a relatively large substrate which is typically formed of a semiconductor material such as 4H silicon carbide. A plurality of semiconductor epitaxial layers are grown or otherwise formed on the wafer to form a semiconductor layer structure. Each power semiconductor device grown on the wafer will typically have an active region and its own edge termination. After the semiconductor layer structure is formed and additional processing steps are completed (e.g., deposition of metal layers), the resultant structure may be diced to separate the individual edge-terminated power semiconductor die. Each power semiconductor die may have a unit cell structure in which the active region of each power semiconductor die includes a plurality of individual "unit cell" devices that are electrically connected in parallel. The power semiconductor die may then be packaged to provide a plurality of power semiconductor devices.

In very high power applications, power semiconductor devices are typically formed in wide band-gap semiconductor material systems (herein, the term "wide band-gap semiconductor" encompasses any semiconductor having a band-gap of at least 1.4 eV) such as, for example, silicon carbide, which has a number of advantageous characteristics including, for example, a high electric field breakdown strength, high thermal conductivity, high electron mobility, high melting point and high-saturated electron drift velocity. Relative to devices formed in other semiconductor materials such as, for example, silicon, electronic devices formed in silicon carbide may have the capability of operating at higher temperatures, at high power densities, at higher speeds, at higher power levels and/or under higher radiation densities Silicon carbide based power devices offer a number of performance benefits, including high voltage blocking, low on-resistance, high current carrying capabilities, fast switching speeds, low switching losses and the ability to withstand high junction temperatures. These characteristics result in a notable increase in potential power density, which is power processed per area or volume.

SUMMARY

Pursuant to some embodiments of the present invention, semiconductor devices are provided that comprise a semiconductor die that comprises a substrate that has a hexagonal crystal structure, where first and second sides of the semiconductor die extend along respective first and second crystallographic axes of the hexagonal crystal structure of the substrate.

In some embodiments, the first side and the second side meet to define an interior angle that is an obtuse angle.

In some embodiments, the semiconductor die comprises at least five sides when viewed in plan view. In some embodiments, the semiconductor die has a hexagon shape when viewed in plan view. In some embodiments, the semiconductor die has an irregular polygon shape when viewed in plan view. In some embodiments, the semiconductor die has a hexagon shape with beveled corners when viewed in plan view.

In some embodiments, the semiconductor die comprises a MOSFET that comprises an active region that comprises a plurality of unit cell transistors.

In some embodiments, a gate runner of the MOSFET comprises first and second segments that connect at an obtuse angle. In some embodiments, the first and second segments of the gate runner each extend along a periphery of the active region. In some embodiments, a gate pad of the MOSFET is located in a center of the active region, and the gate runner comprises a plurality of additional segments that extend outwardly from the gate pad.

In some embodiments, a gate runner of the MOSFET comprises first and second segments that connect at an angle of between 115° and 125°.

In some embodiments, the semiconductor die has a polygonal shape when viewed in plan view, wherein corners of the polygonal shape define interior angles that exceed 90°.

In some embodiments, the substrate comprises a silicon carbide substrate or a gallium nitride substrate.

Pursuant to further embodiments of the present invention, semiconductor devices are provided that comprise a semiconductor die that comprises at least five sides when viewed in plan view.

In some embodiments, the semiconductor die comprises a semiconductor layer that has a hexagonal crystal structure.

In some embodiments, the semiconductor die has a hexagon shape when viewed in plan view.

In some embodiments, the semiconductor die has an irregular hexagon shape when viewed in plan view.

In some embodiments, the semiconductor die has a hexagon shape with beveled corners when viewed in plan view.

In some embodiments, at least three of the sides of the semiconductor die extend along crystallographic axes of the hexagonal crystal structure of the semiconductor layer.

In some embodiments, all of the sides of the semiconductor die extend along crystallographic axes of the hexagonal crystal structure of the semiconductor layer.

In some embodiments, the semiconductor die comprises a MOSFET that comprises an active region that comprises a plurality of unit cell transistors, and a gate runner of the MOSFET comprises first and second segments that connect at an obtuse angle. In some embodiments, the obtuse angle is an angle of 120°. In some embodiments, the first and second segments of the gate runner each extend along a periphery of the active region. In some embodiments, a gate pad of the MOSFET is located in a center of the active region, and the gate runner comprises a plurality of additional segments that extend radially outwardly from the gate pad.

In some embodiments, the semiconductor die has a polygonal shape when viewed in plan view, wherein corners of the polygonal shape define interior angles that exceed 90°.

In some embodiments, the semiconductor layer comprises a silicon carbide substrate or a gallium nitride substrate.

Pursuant to additional embodiments of the present invention, semiconductor devices are provided that comprise a semiconductor die that, when viewed in plan view, has a polygonal shape with corners that define interior angles that exceed 90°.

In some embodiments, the semiconductor die comprises a semiconductor layer that has a hexagonal crystal structure.

In some embodiments, the polygonal shape is a hexagon. In some embodiments, the polygonal shape is an irregular hexagon shape.

In some embodiments, at least two sides of the semiconductor die extend along crystallographic axes of the hexagonal crystal structure of the semiconductor layer. In some embodiments, all sides of the semiconductor die extend along crystallographic axes of the hexagonal crystal structure of the semiconductor layer.

In some embodiments, the semiconductor die comprises a MOSFET that an active region that comprises a plurality of unit cell transistors, and a gate runner of the MOSFET comprises first and second segments that connect at an obtuse angle. In some embodiments, the obtuse angle is an angle of 120°. In some embodiments, the first and second segments of the gate runner each extend along a periphery of the active region. In some embodiments, a gate pad of the MOSFET is located in a center of the active region, and wherein the gate runner comprises a plurality of additional segments that extend radially outwardly from the gate pad.

In some embodiments, the semiconductor layer comprises a silicon carbide substrate or a gallium nitride substrate.

Pursuant to further embodiments of the present invention, semiconductor devices are provided that comprise a semiconductor die that has a polygonal shape when viewed in plan view with beveled corners.

In some embodiments, the semiconductor die comprises a semiconductor layer that has a hexagonal crystal structure.

In some embodiments, the polygonal shape has six major sides and the beveled corners comprise six beveled corners In some embodiments, at least two of the sides of the semiconductor die extend along crystallographic axes of the hexagonal crystal structure of the substrate. In some embodiments, all of the sides of the semiconductor die extend along crystallographic axes of the hexagonal crystal structure of the semiconductor layer.

In some embodiments, the semiconductor die comprises a MOSFET that comprises an active region that comprises a plurality of unit cell transistors, and a gate runner of the MOSFET comprises first and second segments that connect at an obtuse angle. In some embodiments, the obtuse angle is an angle of 120°. In some embodiments, the first and second segments of the gate runner each extend along a periphery of the active region. In some embodiments, a gate pad of the MOSFET is located in a center of the active region, and the gate runner comprises a plurality of additional segments that extend radially outwardly from the gate pad.

Pursuant to further embodiments of the present invention, semiconductor devices are provided that comprise a semiconductor die a semiconductor layer structure that comprises an active region and a gate runner on the semiconductor layer structure that comprises first and second segments that connect at an obtuse angle.

In some embodiments, the obtuse angle is an angle of 120°.

In some embodiments, the first and second segments of the gate runner each extend along a periphery of the active region.

In some embodiments, the gate runner further comprises third and fourth segments, and the first through fourth segments define respective first through fourth sides of a hexagon when viewed in plan view.

In some embodiments, a gate pad of the MOSFET is located in a center of the active region, and the gate runner comprises a plurality of additional segments that extend radially outwardly from the gate pad. In some embodiments, the plurality of additional segments are radially spaced apart from each other by 60°.

In some embodiments, the semiconductor die is a hexagonally-shaped semiconductor die.

Pursuant to further embodiments of the present invention, semiconductor devices are provided that comprise a semiconductor die that has a semiconductor layer structure that comprises an active region and a gate runner on the semiconductor layer structure that comprises first, second and third segments that extend along respective first, second and third crystallographic axes of a semiconductor substrate of the semiconductor layer structure.

In some embodiments, the first, second and third segments of the gate runner each extend along a periphery of the active region.

In some embodiments, the gate runner further comprises a fourth segment, and wherein the first through fourth segments define respective first through fourth sides of a hexagon when viewed in plan view.

In some embodiments, the semiconductor die is a hexagonally-shaped semiconductor die.

Pursuant to further embodiments of the present invention, semiconductor devices are provided that comprises a semiconductor die a semiconductor layer structure that comprises an active region, a gate pad on the semiconductor layer structure, and a plurality of gate runner segments that extend radially from the gate pad to corners of the semiconductor die.

In some embodiments, the gate pad is located in a central portion of the active region.

In some embodiments, the semiconductor device further comprises an additional plurality of gate runner segments that extend along a periphery of the active region.

In some embodiments, the semiconductor die is a hexagonally-shaped semiconductor die.

In some embodiments, the gate pad is located in a center of the active region.

In some embodiments, the semiconductor layer structure includes a 4H silicon carbide substrate.

DETAILED DESCRIPTION

Figure 1A:
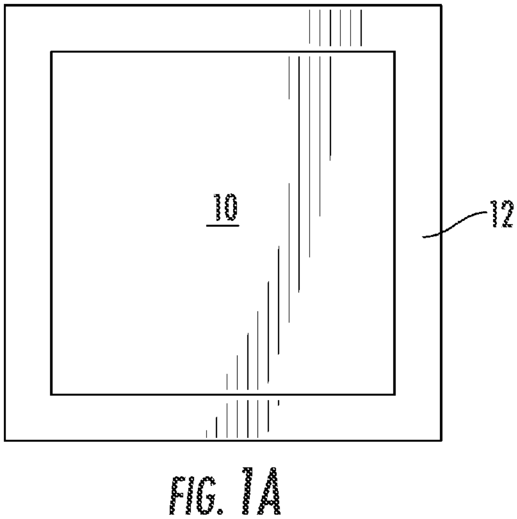
FIGS. 1A and 1B are a schematic plan (top) view and a perspective view, respectively, of a conventional semiconductor die mounted on a submount.

Power semiconductor devices typically have parasitic resistances, capacitances and/or inductances which may be within the semiconductor die itself, in the electrical leads that connect the semiconductor die to external components, and/or in the protective packaging for the device. These parasitic resistances, capacitances, and inductances act to store and/or dissipate electrical and thermal energy. These imperfections manifest as wasted energy during device operation. For example, the processing of electrical power results in waste heat due to conduction and switching losses. Removal of this waste heat results in a rise in temperature due to thermal resistances and capacitances.

As a power semiconductor device operates over its lifetime, it will typically heat up and cool down many, many times. Moreover, many power semiconductor devices, such as ones used in electrical vehicles, power generation substations and the like are subjected to extreme environments, including cold weather conditions, high ambient temperatures (e.g., under the hood of a vehicle), and high humidity. As the semiconductor device heats up and cools down, the materials of the semiconductor die and protective package will expand and contract. The rate at which the different materials in the die and package expand and contract is governed by their respective Coefficients of Thermal Expansion ("CTE"), which can be quite different for different materials. When two different materials are bonded together, if one material wants to expand or contract more than the other, tensile and compressive stresses are generated within each material as well as at the interfaces between them.

The stresses and strains generated by the above-described thermal cycles, repeated many times over, may fatigue the semiconductor die and/or package structures. In particular, the stresses can damage the device, resulting in a reduction of function all the way up to a catastrophic failure if, for example, cracking occurs. Stresses and strains also can greatly reduce the effectiveness of the interface, or attach, of the semiconductor die to the package. For example, the semiconductor die of a packaged semiconductor device is/are often mounted to a heat spreader, copper pad, lead frame, isolated power substrate or the like, depending on the type of package used and the application. Such heat spreaders, pads, etc. may be mounted on one or both sides of the semiconductor die, and are attached to the die via die attach materials. These die attach layers may be critical, as they may function as all three of an electrical, thermal and mechanical interface between the semiconductor die and the package. As the packaged semiconductor device goes through thermal (heating and cooling) cycles, the stresses and strains generated in the die attach layer(s) can cause cracks, ruptures, etc. which can ultimately result in a significant degradation of the die attach layers to perform their electrical, thermal and/or mechanical functions.

The thermal strains and stresses that may arise in a packaged semiconductor device may be the result of the structural geometry of the components that form the device, the methods of attaching these components, the material makeup of the assembly, and the difference between the temperature extremes encountered during device operation and a temperature which is assumed to be a stress-free state. Accordingly, one way to reduce thermal stains and stresses is to select materials that have similar coefficients of thermal expansion. Unfortunately, however, this is often not practical as the materials serve many different functions and it is often not possible or practical to trade off one performance characteristic for another. For example, softer die attach materials are often more resilient to fatigue, but also exhibit significantly worse thermal conductivity. Thus, the selection of a die attach material involves an inherent tradeoff between reliability and performance, and the improvement in reliability provided by use of the softer die attach materials may not be worth the compromise in performance.

As discussed above, semiconductor die are typically formed using “wafer level” operations in which semiconductor, insulating and metal layers/structures are grown, formed and/or deposited on a semiconductor wafer. The semiconductor wafer is then cut or “diced” into individual semiconductor die through a sawing operation in which a diamond dicing blade is used to saw the wafer into columns and rows. Consequently, most power semiconductor die have a rectangular (typically square) shape with right angled corners that result from sawing the wafer along straight lines. Corners are locations where thermal expansion and its associated stresses and strains are the highest. Corners are also an abrupt transition that can act as a failure initiation site. Moreover, the “sharper” the corner, the greater the stresses and strains and the more likely the corner is to act as a failure initiation site. Unfortunately, a rectangular shape has relatively sharp corners, and hence is challenging from a stress perspective, as the sharp corners are potential failure points. Herein, the “shape” of a semiconductor die refers to the shape of the die when viewed in plan view. Thus, a rectangularly-shaped semiconductor die is a die that appears rectangular when viewed from above.

Figure 1B:
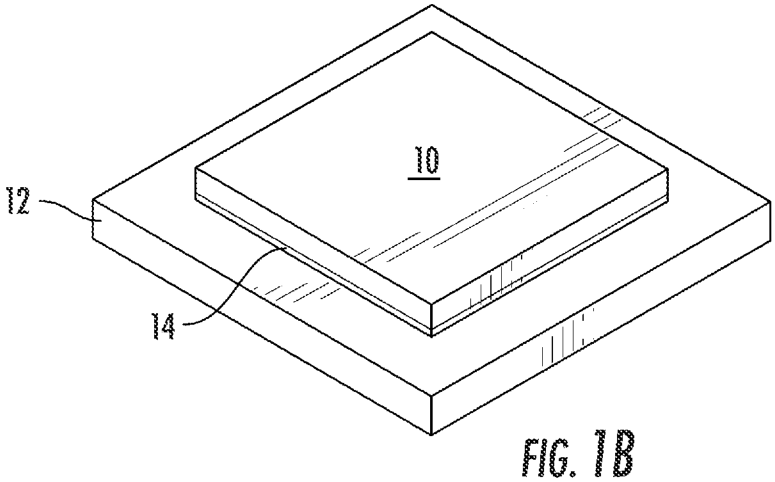

FIGS. 1A and 1B are a schematic plan (top) view and a perspective view, respectively, of a conventional semiconductor die 10 mounted on a submount 12 such as a metal pad. The semiconductor die 10 may be, for example, soldered, sintered, epoxied or the like to the underlying submount 12 via a die attach material 14. If sufficient thermal cycling occurs, cracks in the semiconductor die 10 or the die attach material 14 will often initiate at the corners of either the semiconductor die 10 or the die attach material 14 because the stresses and strains are typically highest in these corner regions. The cracks may then propagate throughout the bulk of the semiconductor die 10 or the die attach material 14 in response to further thermal cycling.

Figure 2:
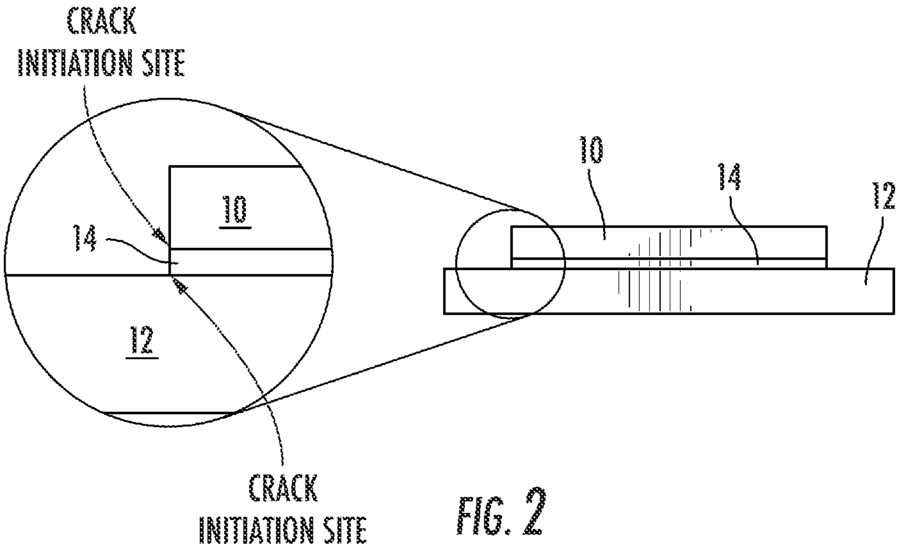
FIG. 2 is a schematic side view of the structure illustrated in FIGS. 1A-1B.

FIG. 2 is a side view of the semiconductor die 10 mounted on the submount 12 that is depicted in FIGS. 1A-1B. In response to thermal cycling or other physical stresses, cracks may initiate at transitions between the different materials, as indicated in FIG. 2, such as at the interface between the semiconductor die 10 and the die attach material 14 or at the interface between the die attach material 14 and the submount 12. The die attach material 14 is a thin layer that requires a material with good electrical, thermal and mechanical properties that allow the die attach material 14 to act as an interface between the semiconductor die 10 and the submount 12. As mentioned above, and shown in FIG. 2, the cracks often form at the corners of the semiconductor die 10 or the die attach material 14, as the thermally-induced stresses are highest in these corner regions.

The “mechanical robustness” of a device refers to the ability of the device to be resilient to stresses and strains, such as stresses and strains that are induced by thermal cycling or other physical forces. There are a number of potential ways to increase the mechanical robustness of a packaged semiconductor device, including reducing the mismatches in the coefficients of thermal expansion between the materials forming the device, reducing abrupt transitions in the geometry of the elements forming the semiconductor device (such as sharp corners), introducing notches or slots to relieve stress concentrations, and/or using materials that are more resilient to stress related failure modes.

Pursuant to embodiments of the present invention, semiconductor devices are provided that may exhibit increased mechanical robustness and/or which may have reduced electrical field concentrations at the device edges. In some embodiments, the semiconductor devices may include semiconductor die that have non-rectangular shapes, such as polygonal shapes that have more than four sides. Such semiconductor die may have corners that form interior angles that exceed 90°, and hence are not as “sharp” as the corners of rectangular semiconductor die that have 90° interior angles. Such “softer” corners will exhibit less stress buildup in response to thermal cycling or physical forces, and hence may be less prone to crack generation, delamination and/or device failure. In other embodiments, the semiconductor die may have rounded or beveled corners that exhibit the same advantage of less stress buildup. In each of the above embodiments, the selected shape for the semiconductor die preferably has a good packing density in order to efficiently utilize as much of the wafer as possible. It should be noted that electric field crowding effects can result in high electric field concentrations in corner regions of semiconductor die, with the amount of electric field buildup generally increasing the sharper the corners of the die. Thus, by providing semiconductor die having “softer” corners, the electric field crowding effects can be reduced in the termination region of the semiconductor die. This may improve the robustness of the semiconductor device or may allow the size of the termination region to be reduced, thereby increasing the amount of active die area.

In still other embodiments of the present invention, semiconductor die are provided that are diced along the crystallographic axes of the substrate of the semiconductor layer structure. Cuts taken along the crystallographic axes of the substrate may be “cleaner” than cuts that are taken off the crystallographic axes. The less “clean” off-axis cuts may generate disruptions within the lattice structure of the semiconductor material, and these disruptions can act as initiation sites for cracking, delamination, degradation of performance and/or device failure. Accordingly, dicing the semiconductor wafer into semiconductor die that have shapes that align with the crystal structure of the substrate of the wafer results in a more rugged semiconductor die that are more resilient stress and hence less likely to be damaged in response to thermal cycling.

Pursuant to still further embodiments of the present invention, semiconductor devices are provided that have semiconductor die with gate runners and/or gate pads that are designed/positioned to improve device performance. For example, in some embodiments, semiconductor die are provided that have gate runners that have segments that connect to each other at angles that exceed 90°, such as angles of 120°. For example, semiconductor die are provided that have gate runners that include at least first, second, third and fourth segments that form respective first, second, third and fourth sides of a hexagon. In other words, the gate runner forms at least four sides of a hexagon shape, and may include additional segments so that the gate runner has a hexagon shape or almost a complete hexagon shape (e.g., a hexagon shape with one or more small gaps). Such a gate runner can extend around at least four sides of a hexagonally-shaped semiconductor die. As another example, semiconductor die are provided that have gate runners that extend radially outwardly from a gate pad located in the center of a hexagonally-shaped semiconductor die. Such a gate runner can further include additional segments that extend at least partially around the periphery of the die. This gate runner design can have relatively short paths for the gate signal to each unit cell transistor.

The semiconductor die according to embodiments of the present invention that have novel shapes/characteristics may be formed using less traditional dicing technologies such as plasma dicing, laser ablation, stealth dicing or thermal laser separation. Plasma dicing, which is also referred to as Deep Reactive Ion Etching, refers to a dry etching process that etches narrow cuts into the wafer using a plasma gas such as Sulpher Hexafluoride. Stealth dicing refers to an internal absorption laser dicing process where a laser beam is passed along a cut line and focused beneath the surface of the wafer. The die are then separated using a tape expander. These less traditional dicing technologies allow a semiconductor wafer to be cut along more than two axes and/or to be cut to provide semiconductor die that have rounded corners.

Thus, according to various embodiments of the present invention, semiconductor devices are provided that comprise a semiconductor die that comprises a substrate that has a hexagonal crystal structure. In some embodiments, first and second sides of the semiconductor die extend along respective first and second crystallographic axes of the hexagonal crystal structure of the substrate. In other embodiments, the semiconductor die may comprise at least five sides when viewed in plan view. In still other embodiments, the semiconductor die may have a polygonal shape when viewed in plan view that has corners that define interior angles that exceed 90°. In yet additional embodiments, the semiconductor die may have a polygonal shape when viewed in plan view with beveled corners.

In any or all of the above-described embodiments, the first and second sides may meet to define an interior angle that is an obtuse angle. The semiconductor die may have, for example, a regular or irregular hexagon shape when viewed in plan view, and may or may not have beveled or rounded corners. The semiconductor die may comprise, for example, a MOSFET that comprises an active region that comprises a plurality of unit cell transistors. In some embodiments, the MOSFET may include a gate runner that comprises first and second segments that connect at an angle that is greater than 90° such as, for example, an angle of 120°. The first and second segments of the gate runner may, for example, each extend along a periphery of the active region. These MOSFETs may alternatively or additionally include a gate pad that is positioned in a center of the active region. In such embodiments, the gate runner may further comprise a plurality of additional segments that extend outwardly from the gate pad. The semiconductor die may include, for example, a 4H silicon carbide substrate.

In still other embodiments of the present invention, semiconductor devices are provided that comprise a semiconductor die that comprises a semiconductor layer structure that has an active region therein. A gate runner is provided on the semiconductor layer structure. The gate runner may, for example, comprise first and second segments that connect at an angle of 120° and/or may comprise comprises first, second and third segments that extend along respective first, second and third crystallographic axes of the semiconductor substrate. In some embodiment, the semiconductor die may further comprise a gate pad on the semiconductor layer structure. In such embodiments, a plurality of gate runner segments may extend radially from the gate pad to corners of the semiconductor die.

Embodiments of the present invention will now be described in more detail with reference to the attached figures. It will be appreciated that features of the different embodiments disclosed herein may be combined in any way to provide many additional embodiments. Thus, it will be appreciated that various features of the present invention are described below with respect to specific examples, but that these features may be added to other embodiments and/or used in place of example features of other embodiments to provide many additional embodiments. Thus, the present invention should be understood to encompass these different combinations.

Figure 3:
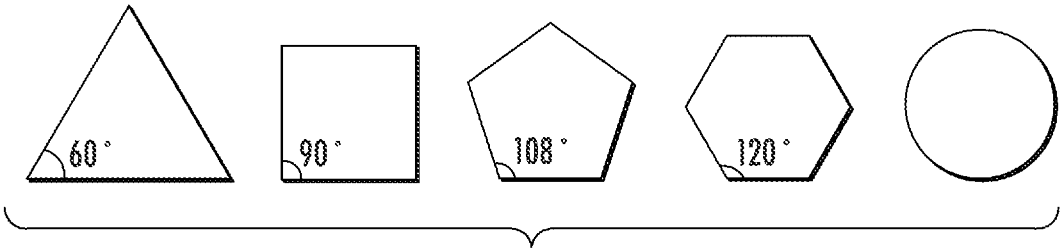
FIG. 3 is a diagram illustrating a series of regular polygons having different numbers of sides.

Thermal and/or physical induced stresses in a semiconductor die build up more in the corners of the die than they do in the middle of the die. Generally speaking, stress induced defects in a device or material are most likely to occur in regions where the stresses are the highest, and hence the corners of a semiconductor die are the regions of the semiconductor die that are most susceptible to stress-induced failures. The sharper the interior angle of the corner, the more the stress builds up. Thus, one way to reduce the magnitude of thermally and/or physically induced stresses is to increase the magnitude of the interior angles of the corners. As shown in FIG. 3, the more sides that are added to a regular polygon-shaped device (a regular polygon refers to a shape that is formed of straight line segments that all have the same length that are joined together to form a closed shape), the greater the interior angles of the corners. For example, as shown in FIG. 3, an equilateral triangle has corners that define interior angles of 60°, a rectangle has corners that define interior angles of 60°, a pentagon has corners that define interior angles of 108°, a hexagon has corners that define interior angles of 120°, etc. As the length of each side is made vanishingly short the polygon is converted into a circle, as is further shown in FIG. 3. Thus, semiconductor die having the shapes shown in FIG. 3 will experience increasingly larger amounts of stress in the corners thereof as you move from the shapes on the right side of the figure to the shapes on the left side of the figure.

It was recognized that failures in many materials will generally start at either a defect or flaw (e.g., a crystal defect, a damaged region of the crystal, or a void, crack, or chip in the crystal) or in a region where stress concentrations are the highest. Various of the approaches described herein focus on dicing a semiconductor wafer into geometrical shapes (when the die/wafer are viewed in plan view) that reduce the abruptness of geometrical transitions and/or which dice the wafer along the crystallographic axes of the wafer substrate in order to reduce stress concentrations in the semiconductor die and/or to strengthen regions of the semiconductor die where natural weaknesses may exist.

Silicon carbide based semiconductor devices are typically formed by growing semiconductor epitaxial layers on a silicon carbide substrate to form a semiconductor layer structure and then processing the wafer (e.g., depositing metal and/or insulation layers on the wafer, performing ion implantation steps, performing various etching steps, etc.) and then dicing the completed wafer into a plurality of discrete semiconductor die, each of which is a separate semiconductor device. The silicon carbide wafer on which the semiconductor epitaxial layers are grown almost always has a round shape when viewed in plan view, and these wafers are diced by sawing the wafer along longitudinal and transverse cut lines to singulate the wafer into the plurality of individual semiconductor die.

Figure 4:
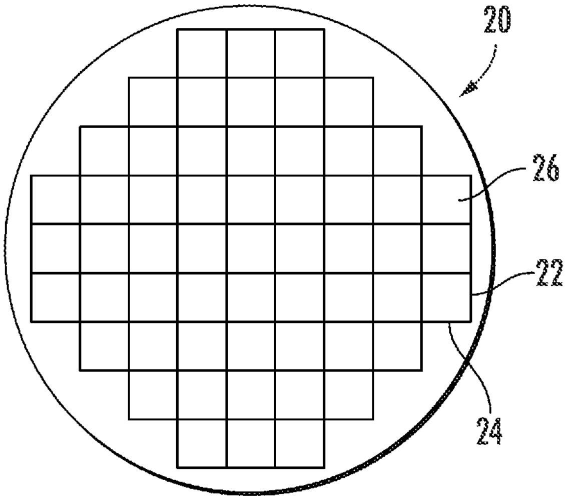
FIG. 4 is a schematic plan view of a conventional silicon carbide semiconductor wafer that illustrates the longitudinal and transverse "cut lines" where the wafer is sawed to singulate the wafer into individual semiconductor die.

FIG. 4 is a plan view of a conventional silicon carbide semiconductor wafer 20, that illustrates the longitudinal and transverse cut lines 22, 24. In the example of FIG. 4, once the wafer 20 is diced, a total of fifty-seven semiconductor die 26 are provided. As discussed above, the rectangular semiconductor die 26 that are formed using such conventional dicing techniques may be prone to failure for two reasons.

Figure 6:
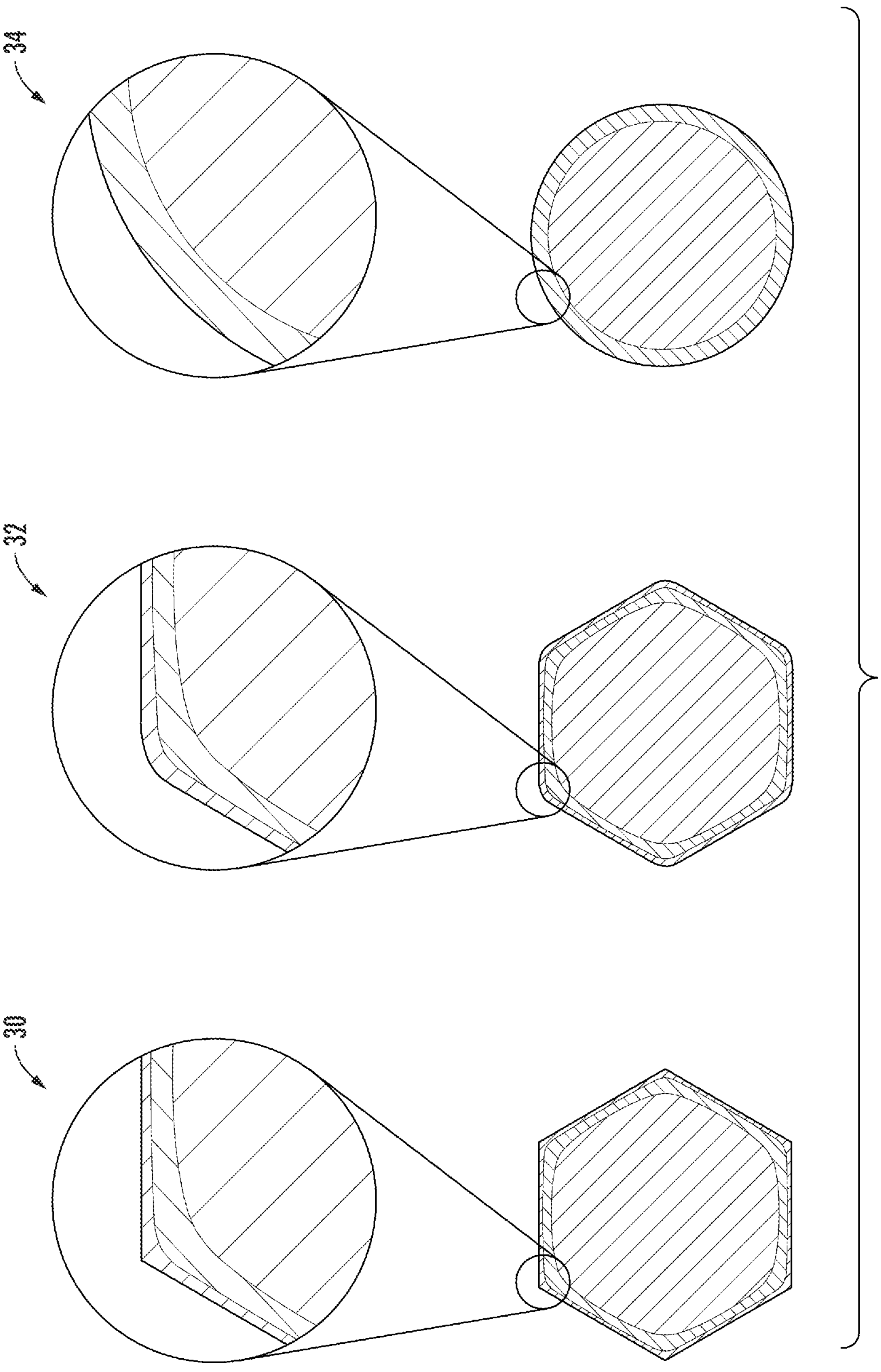
FIG. 6 is a collage of plan views of square, hexagonal and circular semiconductor die that illustrates the relative stress levels throughout each die when the die is bonded to an underlying submount and heated.

First, the relatively sharp 90° angles formed at the corners of the semiconductor die 26 act to build up stress in these regions, creating potential failure points. This can be seen, for example, with reference to FIG. 6, which is a collage of plan views of square semiconductor die 30, a hexagonal semiconductor die 32, and a circular semiconductor die 34 that illustrates the stress concentration in the corners of each die. Enlarged views of corner regions of the respective semiconductor die are shown in callout. In these callouts, the darker the region the greater the stress. As can be seen, very high stress concentrations are generated in the corners of the square semiconductor die 30. The corners of the hexagonal semiconductor die 32 also show increased stress, but the stress is reduced significantly as compared to the square semiconductor die 30. The round semiconductor die 34 represents the optimum shape for reducing the maximum stress concentrations. In all cases, the stress concentrations in the middle or "bulk" of the semiconductor die (i.e., away from the outside edges and any corners) are lower than at the corners, and the stress concentrations in the bulk of each semiconductor die 30, 32, 34 is similar. However, since the failures tend to occur in regions where the stress concentrations are the highest, increasing the interior angles defined at the corners of the semiconductor die by increasing the number of sides acts to significantly reduce the likelihood that cracks form that may result in delamination and/or failure of the semiconductor die.

Second, when 4H silicon carbide semiconductor wafers 20 are used (4H silicon carbide is the type of silicon carbide that is almost always used to form power semiconductor devices), at most only one of the longitudinal cut lines 22 or the transverse cut lines 24 shown in FIG. 4 may extend along a crystallographic axis of the 4H silicon carbide wafer 20, as 4H silicon carbide has a hexagonal crystal structure. When a material is diced along a direction that is not along a crystallographic axis (such a cut is referred to herein as an "off-axis" cut), disruptions occur in the material lattice that weaken the structure of the lattice. These disruptions may manifest as initiations site for cracking, delamination, degradation of performance and/or failure of the semiconductor die.

Pursuant to embodiments of the present invention, semiconductor die are provided that have polygonal shapes when viewed in plan view that have more than four sides. Herein, the "sides" of a semiconductor die refer to the surfaces that connect the top and bottom (major) surfaces of the die. For example, semiconductor die are provided that have hexagonal shapes (or generally hexagonal shapes, such as a hexagonally-shaped die that has a small bevel on each corner) when viewed in plan view. By forming the semiconductor die to have polygonal shapes that have more than four sides, the amount of stress generated in the corners of the semiconductor die can be reduced. Moreover, the use of hexagonally-shaped semiconductor die can be particularly advantageous because, as discussed above, 4H silicon carbide has a hexagonal crystal structure, and hence hexagonally-shaped 4H silicon carbide based semiconductor die can be formed by dicing a semiconductor wafer formed of such materials along the crystallographic axes of the material. Moreover, various other materials that are good candidates for power semiconductor devices such as gallium nitride based materials also have hexagonal crystal structures, and hence hexagonally-shaped power semiconductor die that are formed using gallium nitride or sapphire wafers may also be diced along crystallographic axes of the substrate material. As discussed above, dicing a semiconductor die along the crystallographic axes of the substrate can reduce or eliminate disruptions on the lattice that may result when a semiconductor die is cut off-axis.

Figure 5:
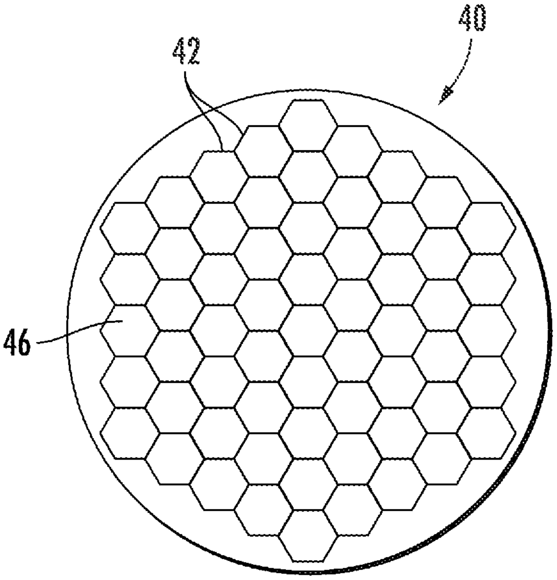
FIG. 5 is a schematic plan view of a silicon carbide semiconductor wafer according to embodiments of the present invention that is configured to be diced into hexagonally-shaped semiconductor die.

In addition, some semiconductor die having polygonal shapes that have more than four sides such as, for example, hexagonally-shaped semiconductor die, may be "packed" to use a larger amount of the area of a circular semiconductor wafer, thus allowing more semiconductor die to be generated from a single wafer. This can be seen, for example, by comparing FIG. 4, which illustrates a semiconductor wafer 20 that will be cut to form square semiconductor die 26 with FIG. 5, which illustrates a semiconductor wafer 40 according to embodiments of the present invention that has hexagonally-shaped semiconductor die 46 formed therein. The semiconductor wafer 40 is cut using, for example, laser beam cutting techniques, to dice the wafer into sixty-one hexagonally-shaped semiconductor die 46. The wafers 20, 40 and semiconductor die 26, 46 have the same respective areas, and hence FIGS. 4 and 5 show that using hexagonally-shaped semiconductor die 46 can increase the amount of a circular wafer that can be used to form individual semiconductor die as compared to a wafer having square semiconductor die.

Another technique which can be used to reduce the inherently higher stress concentrations that can naturally arise in the corners of a semiconductor die is to include one or more beveled cuts in the corner region that replace a sharp angle with two or more larger angles. Each bevel effectively adds an additional side at each corner of the semiconductor die. Thus, for example, if a semiconductor wafer is diced into square semiconductor die where each corner of the square has a bevel, the stress concentration that is generated in each corner may be reduced.

Figure 7:
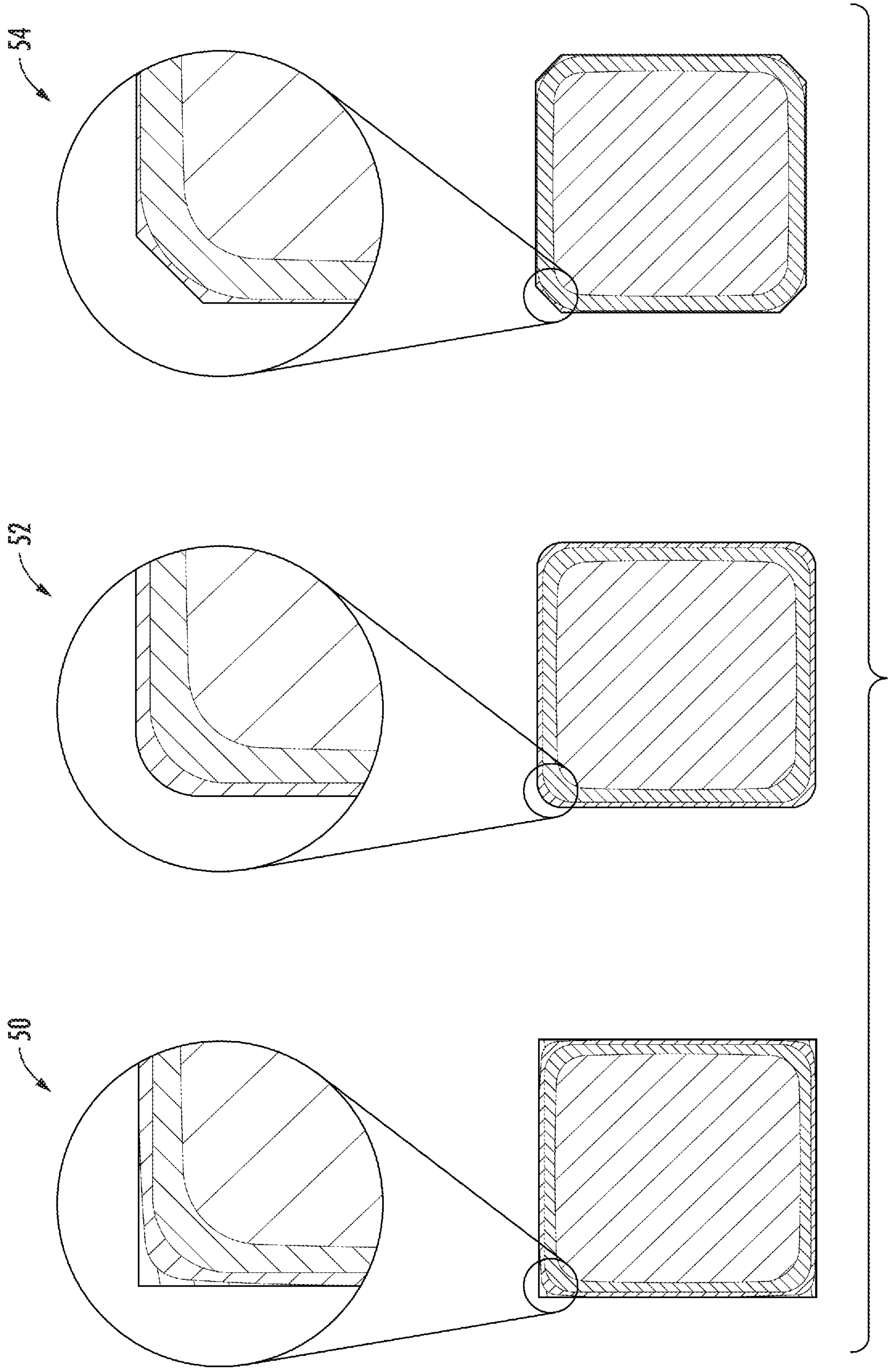
FIG. 7 is a collage of plan views of square semiconductor die having sharp, rounded and beveled corners that illustrates the relative stress levels throughout each die when the die is bonded to an underlying submount and heated.

FIG. 7 illustrates how adding one or more bevels at the corners of a semiconductor die can reduce the maximum stress concentration. In particular, FIG. 7 is a collage that includes plan views of (1) a square semiconductor die 50 that has sharp corners, (2) a square semiconductor die 52 that has rounded corners, and (3) a square semiconductor die that has beveled corners 54. The lightness/darkness of the shading in the callouts FIG. 7 indicate the relative stress levels throughout each semiconductor die when the semiconductor die is bonded to an underlying submount and heated, with darker shading indicating greater stress levels.

Figure 8:
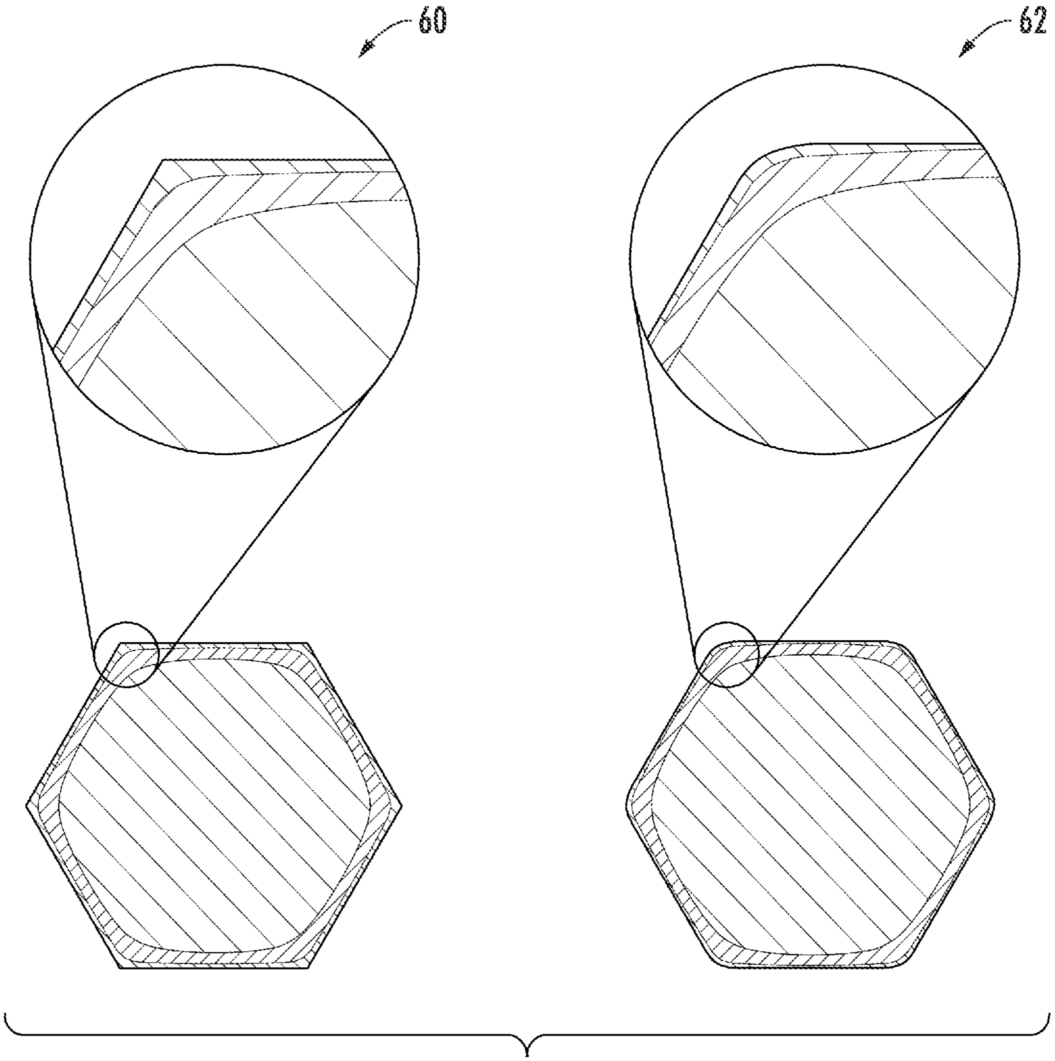
FIG. 8 is a collage of plan views of hexagonal semiconductor die having sharp and rounded corners that illustrates the relative thermally-generated stress levels throughout each die when the die is bonded to an underlying submount and heated.

As shown in FIG. 7, the semiconductor die 50 that has sharp corners exhibits the highest stress concentrations. The view of semiconductor die 54 shows that the stress concentrations can be significantly reduced by adding a 45° bevel at each corner of the square, which effectively converts the square shape into an irregular octagon shape. The maximum stress concentration may be reduced further by rounding the corners, as can be seen with reference to semiconductor die 52. The degree of rounding determines how much additional reduction in stress concentration is achieved. It will be appreciated that the techniques of using semiconductor die that have more than four major sides as well as beveling or rounding of the corners can be combined. For example, FIG. 8 illustrates the relative stress levels generated in a hexagonally-shaped semiconductor die 60 that has sharp corners as compared to a hexagonally-shaped semiconductor die 62 that has rounded corners when the semiconductor die 60, 62 are bonded to an underlying submount and heated. For silicon carbide based semiconductor die (or other semiconductor die having a hexagonal crystal structure), a hexagonal shaped semiconductor die with rounded corners may represent a very attractive choice for reducing the risk of failure, since the hexagonal shape allows the cuts that form the semiconductor die to made along the crystallographic axes of the material.

Figure 9:
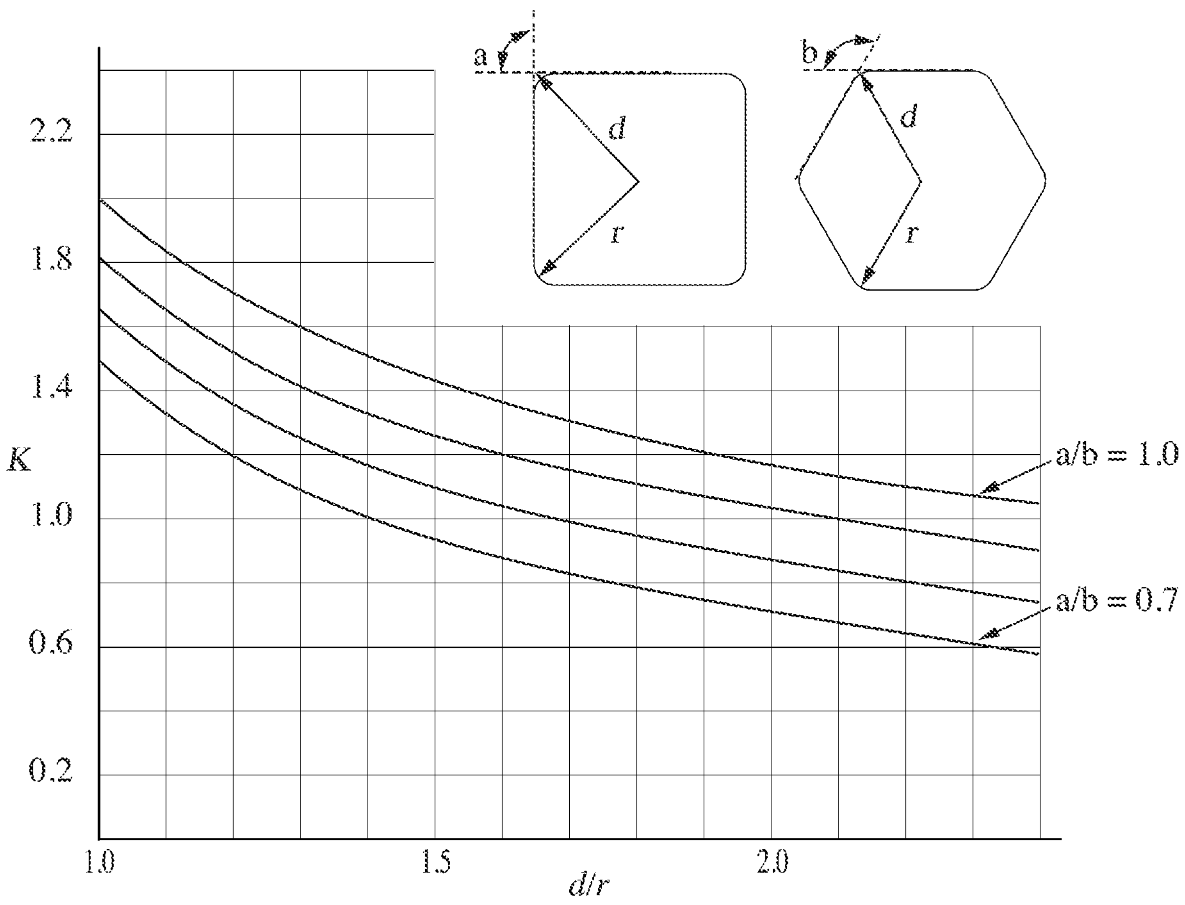
FIG. 9 is an example of a stress-concentration factor design chart that illustrates how the extent to which the corners of the semiconductor die are rounded effects the maximum stress concentration levels in the semiconductor die.

A "stress-concentration factor" K is a scalar value that represents the percentage of increase in the magnitude of the maximum stress levels due to differences in the shapes of different semiconductor die. When, for example, K is equal to 1.5, this means that the magnitude of maximum stress is 50% higher than a default case. FIG. 9 is an example of one stress-concentration factor design chart that illustrates how the extent to which increasing the interior angle defined by each corner of a semiconductor die and rounding the corners of the semiconductor die effect the maximum stress concentration level in the semiconductor die. As shown in FIG. 9, the parameter "r" is the distance from the center of the semiconductor die to the radius at the vertex of the corner, the parameter "d" is the distance from the center of the semiconductor die to the corner of a version of the semiconductor die that is not radiused, the parameter "a" is the interior angle defined by the corners of a first (default) semiconductor die (which here is 90°) and the parameter "b" is the interior angle defined by the corners of a second semiconductor die (which here is shown as being 120°). As shown in FIG. 9, as d/r increases (i.e., as the radius applied at the corners of the semiconductor die is increased), the stress-concentration factor" K decreases. As is also shown in FIG. 9, as the ratio "a/b" decreases (which happens as the interior angle defined by the corners of the second semiconductor die increases with respect to the 90° interior angle defined by the corners of the first (default) semiconductor die), the stress-concentration factor" K decreases. Thus, FIG. 9 shows that two ways to decrease the stress in the corner region of a semiconductor die are to (1) radius the corners of the semiconductor die and (2) increase the number of corners included in the semiconductor die (as this increases the interior angle defined by each corner).

When the corners of the semiconductor die are not rounded, the parameter "d/r" in FIG. 9 is equal to 1.0. As a hexagon has an interior angle of 120° and a rectangle has an interior angle of 90°, the parameter "a/b" is equal to 0.75 when comparing the maximum stress in a hexagonal semiconductor die to the maximum stress in a rectangular semiconductor die. As shown in FIG. 9, by switching from a rectangular semiconductor die to a hexagonal semiconductor die (in each case with non-rounded corners) the stress concentration factor K may be reduced from about 2.0 to about 1.5. FIG. 9 also shows that rounding the corners of the semiconductor die (which increases the parameter d/r) acts to further decrease the stress concentration factor K. As shown in FIG. 9, the biggest decrease in the stress concentration factor K occurs with the initial rounding of the corners, while further rounding of the corners results in a slower decrease in the stress concentration factor K.

Thus, pursuant to some embodiments of the present invention, semiconductor die are provided that have maximum stress levels that are at least 10%, at least 15%, at least 20% or at least 25% less than the maximum stress levels in a default semiconductor die that is identical to the semiconductor die according to embodiments of the present invention except that the default semiconductor die has a rectangular shape. By "identical" it is meant that the two semiconductor die are the same in all aspects (e.g., materials, layer structure, etc.) except for shape, and have the same parameter "d" and, in some embodiments, the same parameter "r."

As discussed above, conventionally semiconductor wafers are singulated using a diamond dicing saw. Generally speaking, this technique can only be used to make straight cuts that extend across the full length or width of the semiconductor die, and hence cannot be used to singulate a semiconductor wafer into semiconductor die having polygonal shapes with more than four sides. Thus, alternative dicing methods may be used to form the semiconductor die according to embodiments of the present invention such as, for example, dicing using a focused laser beam (including lasers that generate beams that are outside the visible spectrum, such as ultraviolet laser beams). With this type of dicing, the laser beam is passed along the cut lines, typically multiple times, and ablates away material. As the beam of energy moves across the wafer, it is not limited to straight lines or orthogonal lines. As such, more complex semiconductor die shapes can be achieved. The laser beam may fully remove the material along the cut lines (i.e., cut all the way through the wafer) or, in many cases, the laser beam may partially cut through the material along the cut lines and then the tape on which the wafer is mounted may be stretched and this may cause the remaining material to separate along the cut lines. Using a laser beam to dice a wafer can be cost effective, as it is fast and may require the removal of less material between devices, thus potentially allowing for more devices to formed on each wafer. Other less traditional dicing techniques such as plasma dicing, stealth dicing or thermal laser separation may also be used.

The semiconductor die according to embodiments of the present invention may have regular polygon shapes or irregular polygon shapes. A regular polygon is a polygon in which all of the sides have the same length. An irregular polygon, on the other hand, is a polygon in which some sides have different lengths. As discussed above, when the corners of a regular polygon are beveled at an appropriate angle, the regular polygon may be converted into an irregular polygon.

Figure 10:
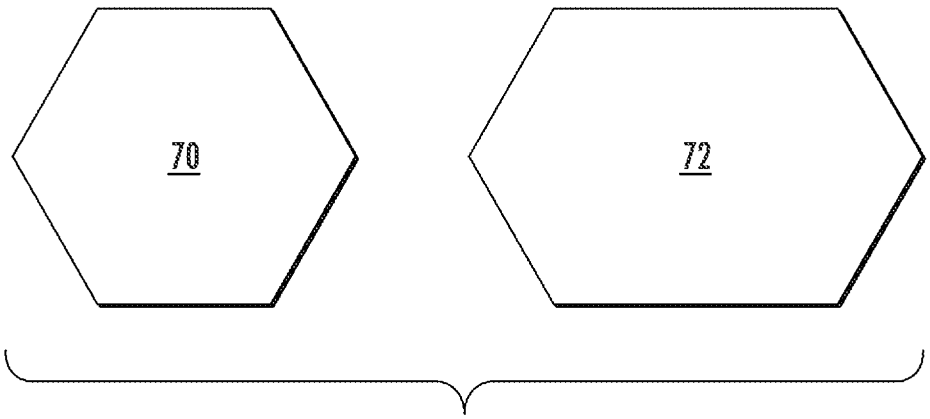
FIG. 10 is a plan view that illustrates how a semiconductor die having the shape of a regular hexagon can be replaced with a semiconductor die having two longer sides in order to increase the semiconductor die area.

Moreover, with some devices, it may be advantageous to form the semiconductor die to have an irregular polygon shape, which may provide increased flexibility in the placement and location of elements of the semiconductor die such as bond pads, gate runners, gate fingers and the like. Semiconductor die with irregular polygon shapes may also better form fit a given package, and provide an alternative technique for increasing device area. FIG. 10 illustrates how a semiconductor die 70 having the shape of a regular hexagon can be replaced with a semiconductor die 72 having two longer sides (converting the regular hexagon into an irregular hexagon) in order to increase the die area. It should be noted that the above-discussed advantages of cuts along the crystallographic axes, reduced stress concentrations in the corners and increased packing density can all also be achieved with the irregular hexagon shaped semiconductor die 72 shown in FIG. 10.

FIGS. 11A-19C illustrate example semiconductor die that may be formed using the techniques discussed above.

Figure 11A:
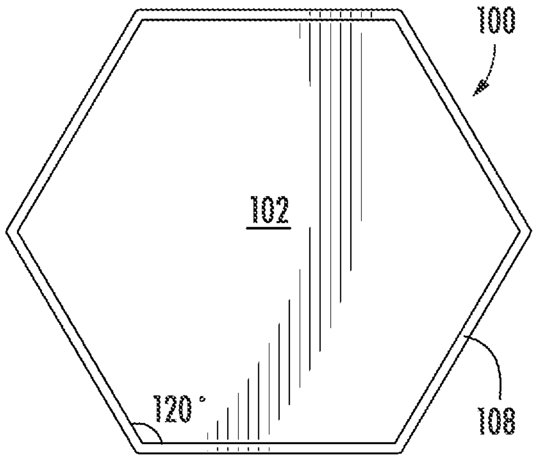
FIGS. 11A and 11B are a schematic plan view and a schematic perspective view, respectively, of a silicon carbide-based power diode semiconductor die according to embodiments of the present invention.
Figure 11B:
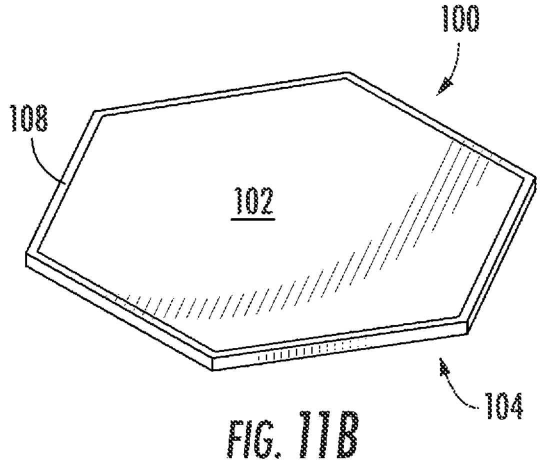

FIGS. 11A and 11B are a plan view and a perspective view, respectively, of a silicon carbide-based power diode semiconductor die 100 according to embodiments of the present invention. As shown in FIGS. 11A-11B, the power diode semiconductor die 100 includes a top side that has a metal anode contact pad 102 thereon and a bottom or "back" side that has a metal cathode contact pad thereon (not visible in the figures). The center of the power diode semiconductor die 100 underneath the anode contact pad 102 may form an active region 106 of the power diode semiconductor die 100 that passes current when the power diode semiconductor die 100 is in its on state, and this active region 106 is surrounded by an edge termination region 108 that is designed to reduce the electrical field levels along the outer perimeter of the power diode semiconductor die 100, as these electrical fields may otherwise achieve very high levels during device operation due to electric field crowding effects that occur around the periphery of the semiconductor die, particularly during reverse blocking operation. The sharper (smaller) the interior angle defined at each corner, the greater the electrical field crowding effects, and hence the higher the generated electric fields in the corners of the semiconductor die. The power diode semiconductor die 100 may have a 4H silicon carbide substrate and a plurality of silicon carbide semiconductor layers formed thereon.

The power diode semiconductor die 100 has a regular hexagon shape. As such, the interior angles defined by the corners of the semiconductor die exceed 90° (here each angle is) 120°, as shown in FIG. 11A. As discussed above, these larger interior angles (as compared to square shaped semiconductor die) have reduced stress concentrations in the corners of the semiconductor die 100. In addition, since the power diode semiconductor die 100 has a silicon carbide substrate, all of the cut lines may be aligned with respective crystallographic axes of the silicon carbide substrate, and hence the six cuts (a cut along each side of the semiconductor die 100) that are used to singulate the semiconductor die 100 may each be along a respective crystallographic axis of the silicon carbide substrate. This may result in "cleaner" cuts that cause less damage to the silicon carbide substrate and semiconductor epitaxial layers, thereby generating fewer weakened points in the crystal lattice that can later act as initiation points that may lead to damage or failure of the semiconductor die 100. In addition, since the interior angles defined by the corners of the hexagonal semiconductor die 100 are larger (120°) than the interior angles (90°) present in a conventional square-shaped semiconductor die, the electric field levels in semiconductor die 100 may be less than in the corresponding electric field levels in the conventional square semiconductor die (all else being equal). As such, the size of the edge termination may be reduced in the semiconductor die 100 while maintaining the same electric field levels as in the conventional square semiconductor die.

While FIGS. 11A-11B illustrate a power diode semiconductor die 100 that has a regular hexagon shape as an example, it will be appreciated that pursuant to the techniques disclosed herein the power diode semiconductor die may comprise any polygon shape that has more than four sides (or corners with angles greater than 90°) and may comprise a regular or an irregular polygon shape. Additionally, corners of the hexagonal shape may be beveled in some embodiments.

The power diode semiconductor die 100 discussed above with reference to FIGS. 11A-11B is a two-terminal device. Most power semiconductor devices are three-terminal devices, such as MOSFETs, JFETs, IGBTs, gate-controlled thyristors and the like. Three-terminal semiconductor die typically have a large pad on the topside that acts as a first current carrying terminal (e.g., a source terminal, emitter terminal, etc.) and a smaller pad on the topside that acts as the gate terminal (i.e., the terminal that controls current flow through the device). For some device technologies (e.g., many MOSFETs and IGBTs), low impedance traces called gate runners are used to reduce the impedance of the conductive structures that distribute signals input at the gate pad to gate fingers that run through the active region of the semiconductor die. These semiconductor die typically also have a large pad on the backside that acts as a second current carrying terminal (e.g., a drain terminal, collector terminal, etc.). Around the perimeter of the topside of the semiconductor die a termination region is typically formed that is designed to reduce the electrical field levels along the outer perimeter of the semiconductor die.

Figure 12A:
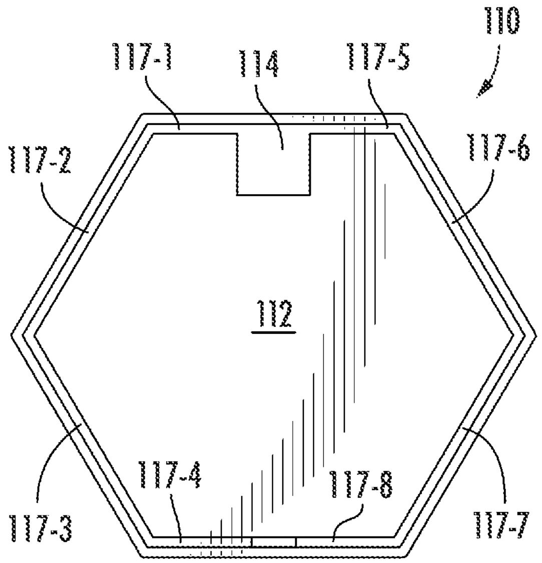
FIGS. 12A and 12B are a schematic plan view and a schematic perspective view, respectively, of a silicon carbide-based power MOSFET semiconductor die according to further embodiments of the present invention.
Figure 12B:
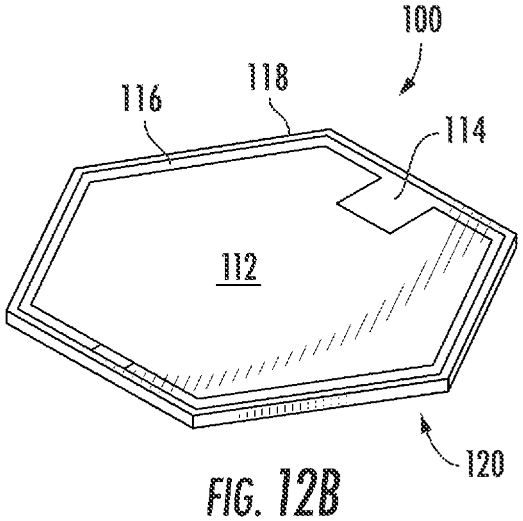

FIGS. 12A and 12B are a plan view and a perspective view, respectively, of a silicon carbide-based power MOSFET semiconductor die 110 according to embodiments of the present invention. As shown in FIGS. 12A-12B, the power MOSFET semiconductor die 110 includes a top side that has a large metal source contact pad 112 thereon and a smaller gate contact pad 114 that is electrically insulated from the source contact pad 112. A gate runner 116 is electrically connected to the gate contact pad 114 (and insulated from the source contact pad 116) and extends substantially around the perimeter of the semiconductor die 110. The MOSFET 110 includes an active region (not visible in FIGS. 12A-12B since the active region is underneath the source contact pad 112), which is a portion of the semiconductor layer structure that is within the region that is substantially bounded by the gate runner 116. An edge termination region 118 extends around the periphery of the semiconductor die 110 outside the gate runner 116. The "back" side of the semiconductor die 110 has a metal drain contact pad 120 thereon that can cover substantially all of the back side of the semiconductor die 110.

Figure 12C:
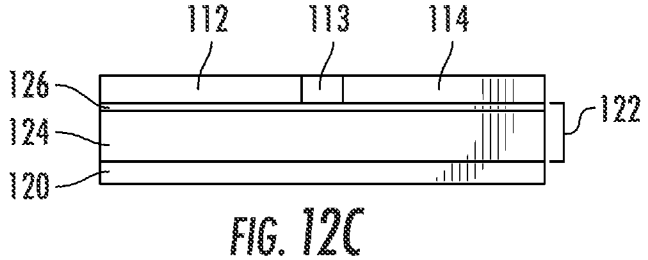
FIG. 12C is a schematic side view of a portion of the semiconductor die of FIGS. 12A-12B.

FIG. 12C is a schematic side view of a portion of the semiconductor die 110 of FIGS. 12A-12B. As shown, the semiconductor die 110 includes a semiconductor layer structure 122 that comprises a semiconductor substrate 124 and a plurality of semiconductor epitaxial layers 126 that are formed on an upper surface of the semiconductor substrate 124. The drain contact pad 120 is formed on the lower surface of the semiconductor substrate 124, and the source contact pad 112 and the gate contact pad 114 are formed on the upper surface of the semiconductor epitaxial layers 126. An insulating pattern 113 (which is not visible in the plan and perspective views of FIGS. 12A-12B) insulates the gate contact pad 114 from the source contact pad 112.

The power MOSFET semiconductor die 110 has a hexagon shape. As shown in FIGS. 12A-12B, the gate contact pad 114 is located along one of the sides of the hexagon. The gate runner 116 extends from the upper left corner of the gate contact pad 114 and runs around most of the periphery of the upper surface of the semiconductor die 110. The gate runner 116 includes a plurality of interconnected linear segments, including first and fifth segments 117-1, 117-5 that extend from respective upper corners of the gate contact pad 114, second, third, sixth and seventh segments 117-2, 117-3, 117-6 and 117-7 that each extend along a full side of the hexagon, and fourth and eighth segments 117-4, 117-8 that each extend partly along the side of the hexagon that is opposite the gate contact pad 114. The first segment 117-1 is positioned between and connected to the gate contact pad 114 and the second segment 117-2, the second segment 117-2 is positioned between and connected to the first segment 117-1 and the third segment 117-3, and the third segment 117-3 is positioned between and connected to the second segment 117-2 and the fourth segment 117-4. Similarly, the fifth segment 117-5 is positioned between and connected to the gate contact pad 114 and the sixth segment 117-6, the sixth segment 117-6 is positioned between and connected to the fifth segment 117-5 and the seventh segment 117-7, and the seventh segment 117-7 is positioned between and connected to the sixth segment 117-6 and the eighth segment 117-8. Each segment 117 connects to its adjacent segments at interior angles of 120°.

The power MOSFET semiconductor die 110 has a regular hexagon shape, and hence will have the same advantages over conventional square semiconductor dies that are discussed above with reference to power diode semiconductor die 100 of FIGS. 11A-11B. Moreover, while FIGS. 12A-12B illustrate a power MOSFET semiconductor die 110 that has a regular hexagon shape as an example, it will be appreciated that pursuant to the techniques disclosed herein the power MOSFET semiconductor die (and other three terminal power semiconductor die) may comprise any polygon shape that has more than four sides (or corners with angles greater than 90°), may comprise a regular or an irregular polygon shape, and/or may include beveled or rounded corners.

Thus, as shown in FIGS. 12A-12B, pursuant to some embodiments of the present invention, semiconductor devices are provided that comprise a semiconductor die 110 that comprises a semiconductor substrate 124 that has a hexagonal crystal structure. The semiconductor substrate 124 may comprise a 4H silicon carbide substrate in some embodiments. In some embodiments, first and second sides of the semiconductor die 110 extend along respective first and second crystallographic axes of the hexagonal crystal structure of the semiconductor substrate 124. In other embodiments, the semiconductor die 110 may comprise at least five sides when viewed in plan view. In still other embodiments, the semiconductor die 110 may have a polygonal shape when viewed in plan view that has corners that define interior angles that exceed 90°. The semiconductor die 110 may comprise, for example, a MOSFET that comprises an active region that comprises a plurality of unit cell transistors.

Figure 13A:
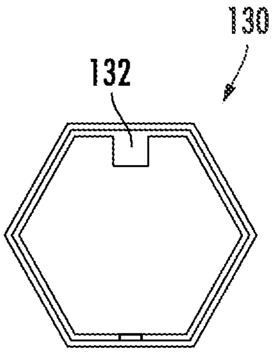
FIGS. 13A-13F are schematic plan views of six three-terminal hexagonally-shaped power semiconductor die (e.g., power MOSFETs) according to embodiments of the present invention that have gate pads located in various positions.
Figure 13B:
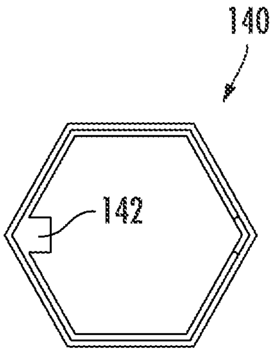
Figure 13C:
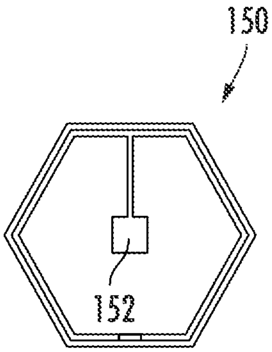
Figure 13D:
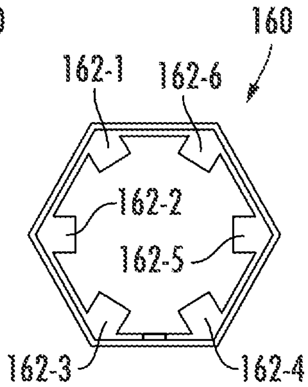
Figure 13E:
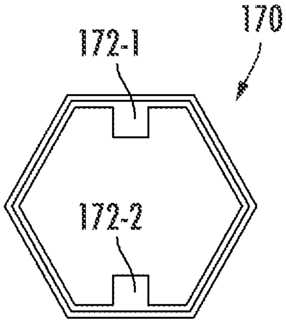
Figure 13F:
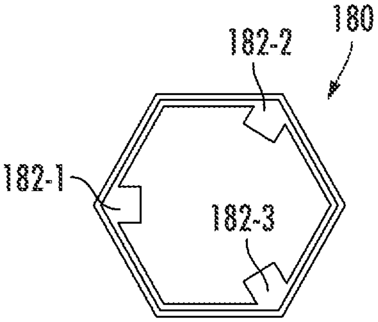
Figure 14A:
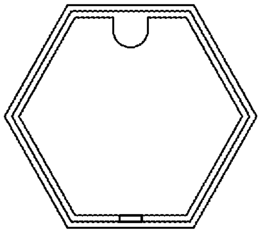
FIGS. 14A-14D are schematic plan views of four three-terminal hexagonally-shaped power semiconductor die according to embodiments of the present invention that have circular gate pads or gate pads that include at least a semicircular section.
Figure 14B:
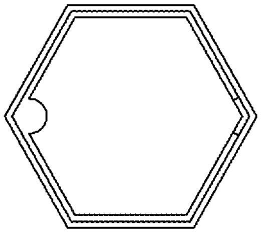
Figure 14C:
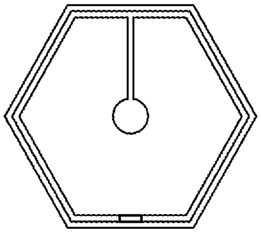
Figure 14D:
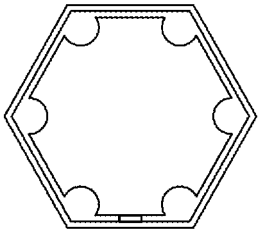
Figure 15A:
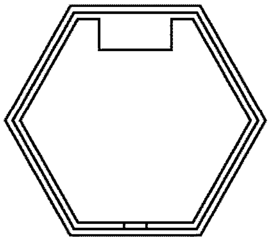
FIGS. 15A-15D are schematic plan views of four three-terminal hexagonally-shaped power semiconductor die according to embodiments of the present invention that have rectangular gate pads or irregular pentagon gate pads.
Figure 15B:
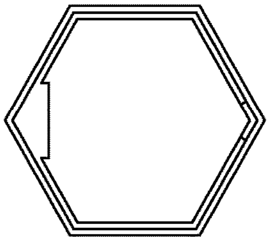
Figure 15C:
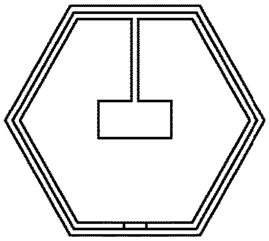
Figure 15D:
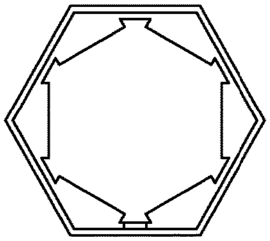
Figure 16A:
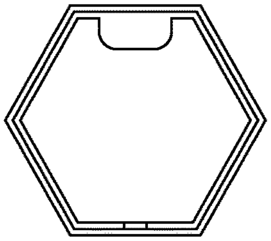
FIGS. 16A-16D are schematic plan views of four three-terminal hexagonally-shaped power semiconductor die according to embodiments of the present invention that have rectangular or irregular pentagon shaped gate pads where at least some of the corners of the gate pads are rounded.
Figure 16B:
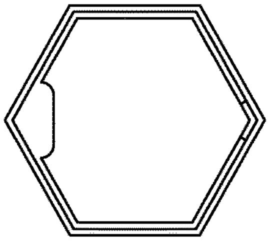
Figure 16C:
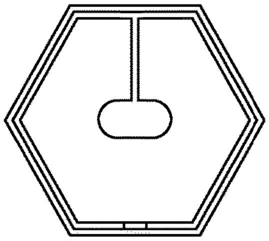
Figure 16D:
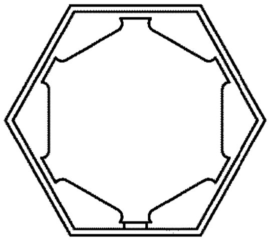

Pursuant to further embodiments of the present invention, power MOSFET semiconductor die (and other three-terminal semiconductor die) are provided that have a variety of different designs for the gate pads and/or gate runners. For example, FIGS. 13A-13F illustrate three-terminal, hexagonal-shaped power semiconductor die (e.g., power MOSFETs) that have gate pads located in various different positions. For example, in the semiconductor die 130 illustrated in FIG. 13A, the gate pad 132 is positioned adjacent a first side of the semiconductor die 130, and is generally centered along the center of the side. Note that semiconductor die 130 may be identical to semiconductor die 120 of FIGS. 12A-12B. In contrast, FIG. 13B illustrates a semiconductor die 140 that has a gate pad 142 that is positioned at the junction of two sides of the semiconductor die 140. FIG. 13C illustrates a semiconductor die 150 that has a gate pad 152 that is positioned in the center of semiconductor die 150. Finally, FIG. 13D illustrates a semiconductor die 160 that has gate pads 162-1 through 162-6 that are positioned at each of the junctions of two sides of the semiconductor die 160. While not pictured separately, it will be appreciated that in other embodiments semiconductor die may be provided that have gate pads positioned at the center of each side of the semiconductor die (i.e., the semiconductor die of FIG. 13A with an additional five gate pads added along the remaining five sides of the die). It will also be appreciated that the devices that have more than one gate pad may have less than six gate pads. For example, FIG. 13E illustrates a semiconductor die 170 that has two gate pads 172-1, 172-2 positioned adjacent opposed sides of the semiconductor die 170, while FIG. 13F illustrates a semiconductor die 180 that has three gate pads 182-1 through 182-3 that are positioned at three of the six the junctions of two sides of the semiconductor die 180. Having multiple gate pads may involve a tradeoff between gate resistance and packaging flexibility on the one hand, versus the size of the active area on the other hand.

It will also be appreciated that the gate pads may have shapes other than the square or pentagon shapes shown in FIGS. 13A-13F. For example, FIGS. 14A-14D illustrate semiconductor die corresponding to the semiconductor die of FIGS. 13A-13D, except that the semiconductor die in FIGS. 14A-14D have circular gate pads or gate pads that include at least a semicircular section. A circular or rounded gate pad may be used to increase and/or maximize a size of the active area of the device. FIGS. 15A-15D illustrate semiconductor die corresponding to the semiconductor die of FIGS. 13A-13D, except that the semiconductor die in FIGS. 15A-15D have rectangular gate pads or irregular pentagon gate pads. The gate pad size is typically based on the method to which an external circuit is electrically connected to the gate pad (e.g., wire bonding, soldering, sintering, etc.), the size of the structure (e.g., wire bond) that is attached to the gate pad, and the process window for the attachment procedure. Changing from square gate pads to rectangular gate pads may be a convenient way to increase the size of the gate pad (e.g., for devices having large diameter bond wires). FIGS. 16A-16D illustrate semiconductor die corresponding to the semiconductor die of FIGS. 15A-15D, except that the semiconductor die in FIGS. 16A-16D have rectangular or irregular pentagon shaped gate pads where at least some of the corners are rounded.

Figure 17A:
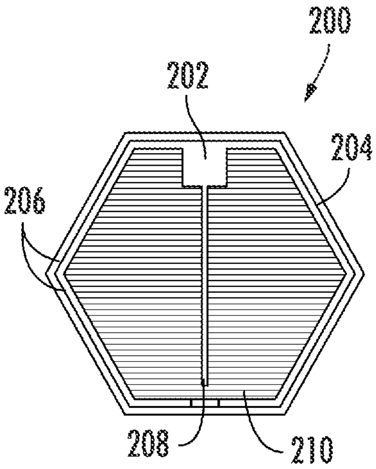
FIGS. 17A-17C are schematic plan views of three hexagonally-shaped power MOSFETs according to embodiments of the present invention that illustrate example positions for the gate runners.
Figure 17B:
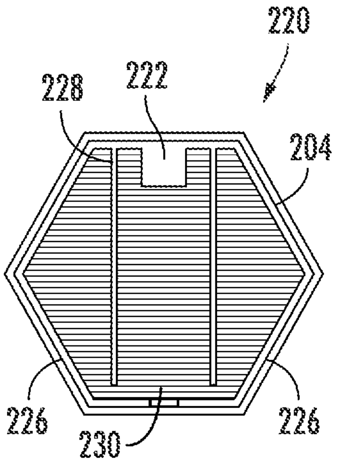
Figure 17C:
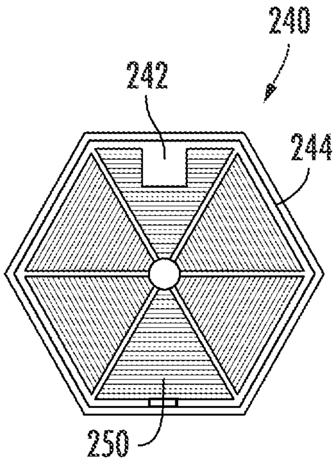

FIGS. 17A-17C illustrate example positions for the gate runners in three-terminal power semiconductor die according to embodiments of the present invention. The gate runners may comprise connections between the gate pad(s) and the gate fingers of the device. In many cases, the gate runners are formed of metal to have a low impedance. The gate runners may include segments that conform to the shape (e.g., a hexagonal shape) of the semiconductor die, and may also include additional segments.

For example, FIG. 17A illustrates a semiconductor die 200 that includes a gate pad 202 and a gate runner 204 that has a plurality of segments 206 that extend substantially all of the way around the periphery of the semiconductor die 200, as well as an additional segment 208 that extends through the center of the semiconductor die 200. A plurality of gate fingers 210 (e.g., silicon gate fingers) are electrically connected to the gate runner 204 (and may be physically connected as well in some embodiments). Gate signals that are input at the gate pad 202 are passed to the gate fingers 210 via the gate runner 204. As shown, in this configuration the gate fingers 210 are broken into two groups, and each gate finger 210 is fed from both sides, reducing the resistance of the paths that the gate signal follows as it travels from the gate pad 202 to and along the individual gate fingers 210. FIG. 17B illustrates a semiconductor die 220 that is a modified version of the semiconductor die 200 of FIG. 17A. The semiconductor die 220 includes a gate pad 222 and a gate runner 224 that has a plurality of segments 226 that extend substantially all of the way around the periphery of the semiconductor die 200, as well as two additional segments 228 that extend through a central region of the semiconductor die 220. In the device of FIG. 17B, three groups of gate fingers 230 are provided, with each gate finger 230 fed from both sides. Semiconductor die 220 may exhibit lower gate resistance values than semiconductor die 200, but at the expense of a reduction in the size of the active region of the device. FIG. 17C illustrates a semiconductor die 240 that includes a gate pad 242 and a gate runner 244 that extends substantially all of the way around the periphery of the semiconductor die 200 and that also includes additional segments 228 that extend radially from the periphery of the semiconductor die 240 into the active region. The radial gate runner segments divide the gate fingers 250 into six groups that extend at different angles relative to each other.

Figure 18A:
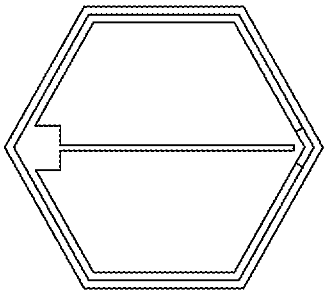
FIGS. 18A-18C are schematic plan views of three hexagonally-shaped power MOSFETs according to embodiments of the present invention that illustrate additional example positions for the gate runners.
Figure 18B:
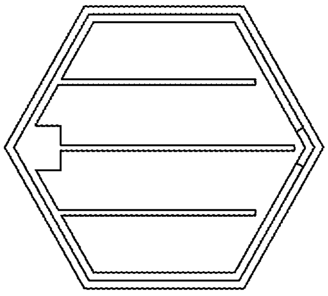
Figure 18C:
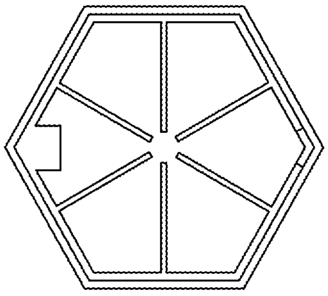
Figure 19A:
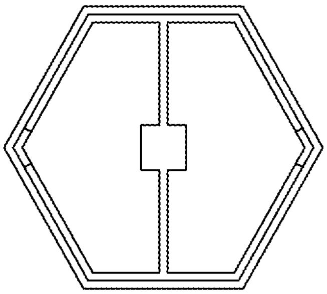
FIGS. 19A-19C are schematic plan views of three hexagonally-shaped power MOSFETs according to embodiments of the present invention that illustrate yet additional example positions for the gate runners.
Figure 19B:
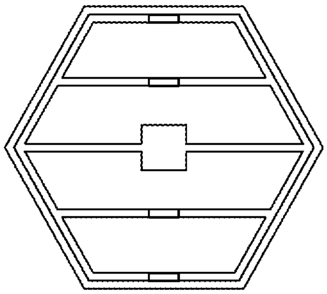
Figure 19C:
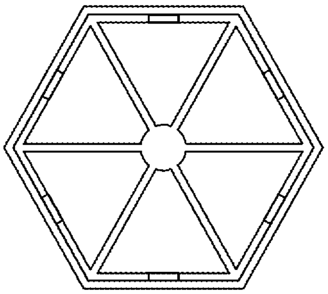
Figure 20A:
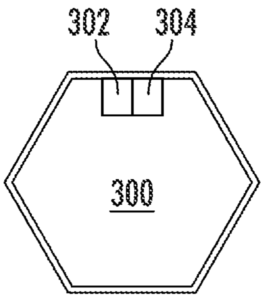
FIGS. 20A-20D illustrate example semiconductor die that have additional top side contact pads.
Figure 20B:
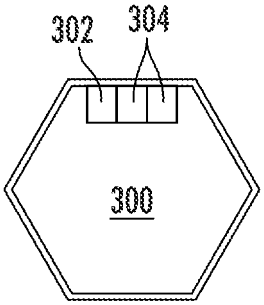
Figure 20C:
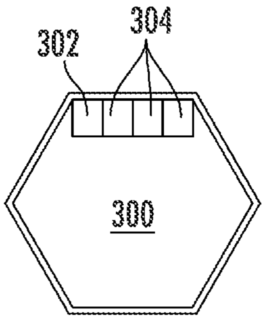
Figure 20D:
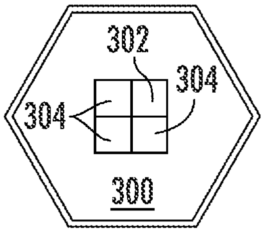

FIGS. 18A-18C illustrate semiconductor die having gate runner designs that are similar to those shown in FIGS. 17-17C, except that the semiconductor die of FIGS. 18A-18C have gate pads that are positioned at the edges of two sides, whereas the semiconductor die of FIGS. 17A-17C have the gate pads centered along a side of the respective semiconductor die. FIGS. 19A-19C similarly illustrate semiconductor die having gate runner designs that are similar to those shown in FIGS. 17A-17C, except that the semiconductor die of FIGS. 19A-19C have gate pads that are positioned in the center of the device. The gate fingers are not shown in FIGS. 18A-19C in order to simplify the figures.

In some cases, three-terminal semiconductor die may require additional contact (bonding) pads that are required for secondary functions. For example, in devices that have soldered or sintered top side connections, a dedicated source kelvin wire bond pad is also provided. As another example, additional secondary bond pads may be needed in some cases for on-chip sensors, such as temperature or current sensors. FIGS. 20A-20D illustrate example semiconductor die that have additional top side contact pads (i.e., a source contact pad 300, a gate contact pad 302 and one or more additional contact pads 304). Many more arrangements may be envisioned in which some or all of the gate contact pads and/or additional contact pads have circular (or partially circular) shapes or rectangular shapes.

The semiconductor die according to embodiments of the present invention may be used in myriad applications, including motor drives, battery chargers, wind/solar inverters, power supplies, etc.

While the present invention is primarily described above with respect to power MOSFET implementations, it will be appreciated that the techniques described herein apply equally well to other power semiconductor devices. Thus, embodiments of the present invention are not limited MOSFETs.

While embodiments of the present invention are primarily discussed above with respect to semiconductor die that have at least five sides when viewed in plan view and/or have corners that define interior angles that are greater than 90°, it will be appreciated that embodiments of the present invention are not limited thereto. In other embodiments, the semiconductor die, when viewed in plan view, may have less than four sides (e.g., three sides to form a triangle) and/or may have corners that define interior angles that are less than 90° such as angles of 60°. Thus, it will be appreciated that all of the hexagon shaped semiconductor die discussed above can be implemented as triangular shaped die in other embodiments.

The present invention has primarily been discussed above with respect to silicon carbide based power semiconductor devices. It will be appreciated, however, that silicon carbide is used herein as an example and that the devices discussed herein may be formed in any appropriate wide band-gap semiconductor material system. As an example, gallium nitride based semiconductor materials (e.g., gallium nitride, aluminum gallium nitride, etc.) may be used instead of silicon carbide in any of the embodiments described above.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

Herein, the term "plurality" means two or more. Herein, "substantially" means within +/−10%.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to a flow chart. It will be appreciated that the steps shown in the flow chart need not be performed in the order shown.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A semiconductor device, comprising:

a semiconductor die that comprises a substrate that has a hexagonal crystal structure, wherein first and second sides of the semiconductor die extend along respective first and second crystallographic axes of the hexagonal crystal structure of the substrate, wherein the semiconductor die comprises a power semiconductor die that has a hexagon shape when viewed in plan view.

2. The semiconductor device of claim 1, wherein the first side and the second side meet to define an interior angle that is an obtuse angle.

3. The semiconductor device of claim 1, wherein the semiconductor die has beveled corners when viewed in plan view.

4. The semiconductor device of claim 1, wherein the semiconductor die comprises a MOSFET that comprises an active region that comprises a plurality of unit cell transistors, and wherein a gate runner of the MOSFET comprises at least a first straight segment, a second straight segment, a third straight segment, a fourth straight segment and a fifth straight segment, and the first straight segment connects to the second straight segment at an obtuse angle.

5. The semiconductor device of claim 4, wherein the first through fifth straight segments each extend along a periphery of the active region, and wherein a gate pad of the MOSFET is located in a center of the active region so that the unit cell transistors are formed on all sides of the gate pad when the gate pad is viewed in plan view, and wherein the gate runner comprises a plurality of additional segments that extend outwardly from the gate pad.

6. The semiconductor device of claim 1, wherein the semiconductor die comprises a MOSFET that comprises an active region that comprises a plurality of unit cell transistors, and wherein a gate runner of the MOSFET comprises first and second segments that connect at an angle of between 115° and 125°.

7. The semiconductor device of claim 6, wherein the gate runner further comprises at least one additional segment that extends outwardly from the gate pad.

8. The semiconductor device of claim 7, wherein the gate runner further comprises a plurality of additional segments that extend radially outwardly from the gate pad.

9. The semiconductor device of claim 1, wherein the semiconductor die comprises a MOSFET that comprises a semiconductor layer structure that comprises a plurality of unit cell transistors and a gate pad on the semiconductor layer structure, wherein the gate pad is positioned adjacent a first location where first and second of the sides of the hexagon shaped semiconductor die meet.

10. The semiconductor device of claim 9, wherein the gate pad comprises a first gate pad, the MOSFET further comprising a second gate pad that is positioned adjacent a second location where third and fourth of the sides of the hexagon shaped semiconductor die meet.

11. A semiconductor device, comprising:

a semiconductor die, wherein the semiconductor die comprises at least five sides when viewed in plan view, and wherein the semiconductor device is a power MOSFET that has a silicon carbide semiconductor layer structure and a gate pad that is on an upper surface of the silicon carbide semiconductor layer structure.

12. The semiconductor device of claim 11, wherein at least three of the sides of the semiconductor die extend along crystallographic axes of a hexagonal crystal structure of the silicon carbide semiconductor layer.

13. The semiconductor device of claim 11, wherein a gate runner of the MOSFET comprises first and second segments that connect at an obtuse angle.

14. The semiconductor device of claim 13, wherein the obtuse angle is an angle of 120°.

15. The semiconductor device of claim 11, wherein the MOSFET further comprises a gate runner that includes a plurality of segments that extend radially outwardly from the gate pad.

16. A semiconductor device, comprising:

a semiconductor die, wherein, when viewed in plan view, the semiconductor die has a hexagon shape, wherein the semiconductor die comprises a MOSFET that comprises a silicon carbide semiconductor layer structure having a plurality of unit cell transistors formed therein, and wherein a gate runner of the MOSFET comprises a first straight segment and a second straight segment that is adjacent the first straight segment, where the first segment and the second segment extend along respective first and second axes that intersect to define an angle of 120°.

17. The semiconductor device of claim 16, wherein the semiconductor die comprises a semiconductor layer that has a hexagonal crystal structure.

18. The semiconductor device of claim 17, wherein at least two sides of the semiconductor die extend along crystallographic axes of the hexagonal crystal structure of the semiconductor layer.

19. The semiconductor device of claim 16, wherein the first and second straight segments of the gate runner each extend along a periphery of the active region.

20. The semiconductor device of claim 19, wherein a gate pad of the MOSFET is located in a center of the active region, and wherein the gate runner comprises a plurality of additional segments that extend radially outwardly from the gate pad.

21. The semiconductor device of claim 16, wherein the MOSFET further comprises a gate pad on the semiconductor layer structure, wherein the gate pad is positioned adjacent a location where the first and second axes intersect.

22. The semiconductor device of claim 16, wherein the MOSFET further comprises a gate pad on the semiconductor layer structure, and the gate runner further comprises a plurality of segments that extend radially outwardly from the gate pad.

23. The semiconductor device of claim 11, wherein the semiconductor die has a hexagon shape with rounded or beveled corners when viewed in plan view.

* * * * *